United States Patent [19]
Harvey

[11] Patent Number: 5,374,898
[45] Date of Patent: Dec. 20, 1994

[54] COMPLEMENTARY GAIN CONTROL CIRCUIT

[75] Inventor: Barry Harvey, Los Altos, Calif.

[73] Assignee: Elantec, Inc., Milpitas, Calif.

[21] Appl. No.: 99,701

[22] Filed: Jul. 30, 1993

[51] Int. Cl.⁵ ............................................. H03F 3/45
[52] U.S. Cl. .................................... 330/254; 330/257
[58] Field of Search ............... 330/254, 257, 278, 288; 381/28

[56] References Cited

U.S. PATENT DOCUMENTS 4,516,081  5/1985  Katakura ..................... 330/254

*Primary Examiner*—Steven Mottola
*Attorney, Agent, or Firm*—Leo V. Novakoski; Albert C. Smith

[57] ABSTRACT

A low power complementary gain control circuit adjusts the gain of an input signal with a gain control signal to provide a ground referenced output signal having low distortion. The gain control circuit includes an input stage having the topology of a current feedback amplifier input stage, which operates in conjunction with a complementary pair of gain control amplifiers and a complementary pair of current mirrors to control the amplitude of an input signal by means of a control signal applied to the gain control amplifiers. Each gain control amplifier comprises a pair of differentially connected transistors of the same conductivity type, the common emitters, the collectors, and the bases of the differentially connected transistors forming the current input, current outputs, and gain control inputs of the gain control amplifier. One current output of each gain control amplifier is connected to one of a pair of complementary current mirrors for coupling signal currents to a common gain node, and the other output is coupled to a corresponding voltage supply. A current signal generated by the input amplifier is coupled to the common emitters of the differentially connected transistor pairs and distributed between the corresponding current mirror and bias supply in accordance with control signals applied to the gain control inputs. The portion of the current signal directed to the complementary current mirrors is replicated at a common gain node, to provide an output current signal. The emitter areas of each complementary pair of differentially connected transistors are adjusted so that the errors due to non-zero $R_{bb}$ are symmetric about zero input current, and a transconductance resistor is connected between the inverting input of the input stage and ground to linearize large input currents.

8 Claims, 3 Drawing Sheets

COMPLEMENTARY GAIN CONTROL CIRCUIT

TECHNICAL FIELD

This invention relates to gain control circuits, and in particular to low power, complementary gain control circuits providing low distortion, ground referenced outputs.

BACKGROUND OF THE INVENTION

Gain control circuits are used in electronics wherever there is a need to control the amplitude of one signal with a second signal. For example, fader circuits use a control signal applied to a pair of gain control circuits to increase the gain of one input signal while simultaneously decreasing the gain of a second input signal. Each gain control circuit in a conventional fader circuit typically includes a differential input transconductance stage and a pair of differential amplifiers. The transconductance stage generates current signals in response to an input signal voltage, and these current signals are coupled to the common emitters of the differential amplifiers. Control signals applied to the bases of the component transistors of the differential amplifiers adjust the gain of the corresponding collector currents. By coupling one collector to a bias supply and the remaining collector to a subsequent stage, the signal current generated by the input stage is distributed between the bias supply and the subsequent stage, in accordance with the control signal applied to the transistor bases. Conventional fader circuits combine two such gain control circuits, and apply control signals having opposite polarities to each pair of differential amplifiers to produce the desired signal fading.

Conventional gain control circuits are simple to implement since they use transistors of a single conductivity type. When used as the components of fader circuits, these gain control circuits provide an output that is zero to within the matching of the component devices when the inputs are zero. On the other hand, there are serious limitations to such conventional gain control circuits. For example, the input circuits are class A amplifiers, and consequently must dissipate considerable power to provide wide dynamic input ranges. Increasing the size of input stage resistors to reduce the quiescent current may produce frequency dependent effects due stray transistor capacitances. In addition, the output of a fader circuit based on such conventional gain control circuits is not referenced to ground, and so must be shifted by an additional stage.

SUMMARY OF THE INVENTION

The present invention is a gain control circuit that combines a low power input stage having the topology of a current feedback amplifier input stage with a complimentary pair of gain control amplifiers to provide ground referenced output signals having low distortion. The class AB current feedback amplifier input stage generates a current signal which is distributed between the complementary gain control amplifiers. Each of the complementary gain control amplifiers distributes the current signal received from the input stage between a pair of current outputs in accordance with a gain control signal applied to a pair of gain control inputs. For example, each gain control amplifier may comprise a pair of differentially connected transistors of a single conductivity type, the common emitters of which form the current input, and the bases and collectors of which form the gain control inputs and current outputs, respectively. Signal current from one current output of each gain control amplifier is coupled to a common gain node by means of a complementary pair of current mirrors, providing an output current signal.

Signal distortion due to the non-zero base resistances of the differentially connected transistors is minimized in the present invention by adjusting the transistor geometry to produce symmetrical errors for positive and negative input currents, and adding an input resistor between the inverting input and ground to linearize the input current. Thus, the emitter areas of the differentially connected transistors are scaled so that the ratio of base resistance to transistor beta for the pnp and npn transistors are equal, insuring that the minimum error occurs for large input currents. In addition, a pre-distortion current is generated in the input resistor when large input currents change the voltage of the inverting input. The direction of flow of the resulting predistortion current is opposite to that of the input current, and has the net effect of reducing the distortion caused by non-linear input impedance.

A pair of gain control circuits in accordance with the present invention may be combined by connecting the gain control amplifiers of each gain control circuit to a common pair of complementary current mirrors. In this configuration, gain control amplifiers comprising transistors of the same conductivity type from each gain control circuit are combined into two quadrant multipliers. One current output from each gain control amplifier is connected to a bias supply and the other is connected to the input of the corresponding current mirror. The outputs of the complementary current mirrors are connected to the common gain node for providing an output signal current. Alternatively, an output voltage signal may be obtained by converting the signal current to a voltage by means of a current feedback type output amplifier. In either case, an output signal is provided in which the input signals are combined with gains determined by a single control signal.

DETAILED DESCRIPTION OF THE INVENTION

Figure 1:
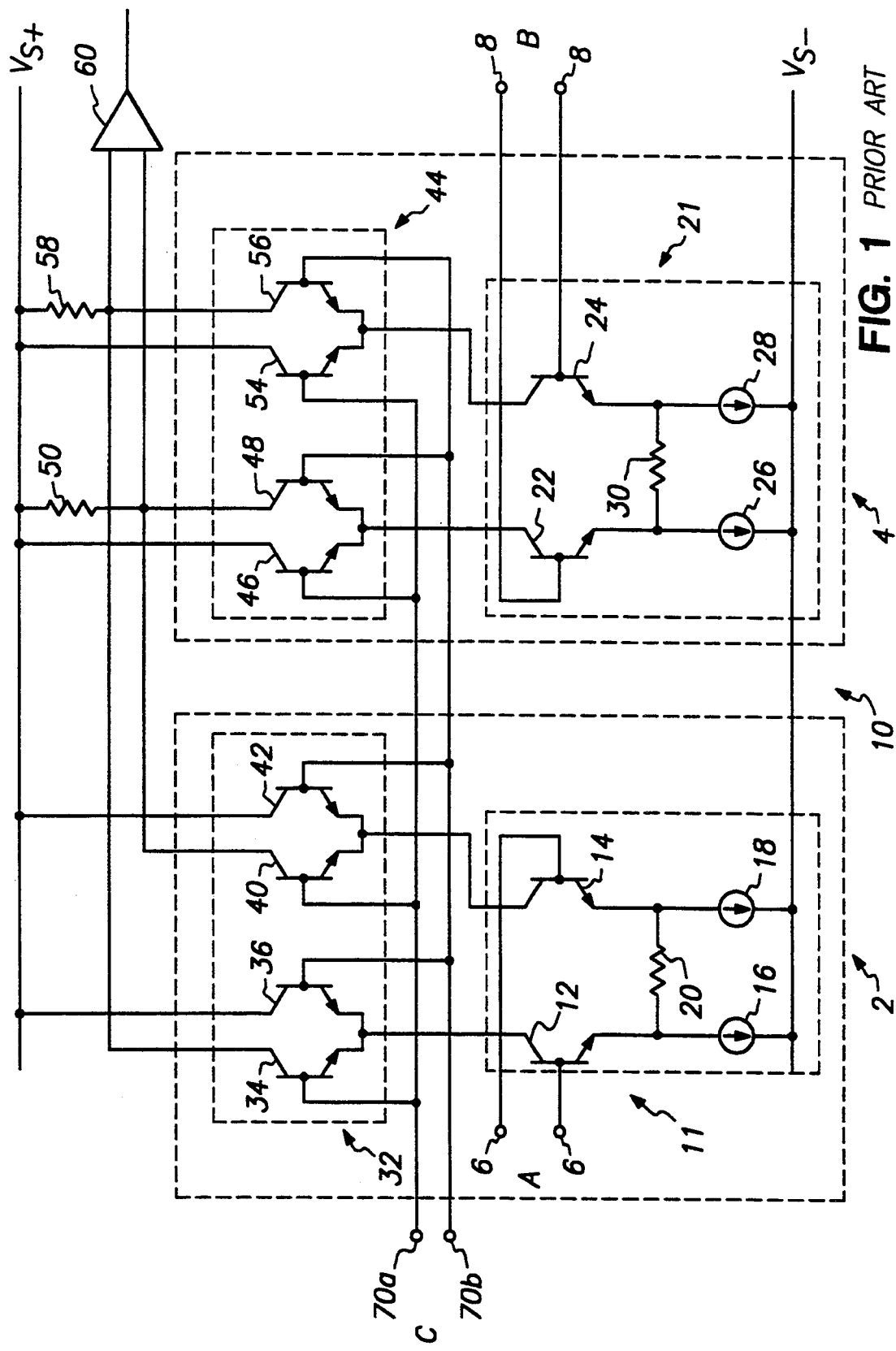
FIG. 1 is a schematic diagram of a conventional fader circuit.

Referring to FIG. 1, there is shown a fader circuit 10, comprising a pair of conventional gain control circuits 2, 4. Each gain control circuit 2,4 includes an input stage 11, 21 and two quadrant gain control circuit 32, 44, respectively, based on npn conductivity type devices. Also shown are output amplifier 60 and control signal inputs 70a, 70b. Transconductance input stage 11 comprises npn transistors 12, 14 each of which has its emitter connected to a current source 16, 18, respectively, and a transconductance resistor 20. Transconductance input stage 21 comprises transistors 22, 24, current sources 26, 28, and a transconductance resistor 30 connected in a manner identical to the corresponding components of input stage 11.

Two quadrant gain control circuit 32 comprises two pairs of differentially connected transistors 34, 36 and 40, 42, respectively. The bases of transistors 34, 40 are connected to control signal input 70a and their collectors are connected to opposite inputs of output amplifier 60, while the bases of transistors 36, 42 are connected to control signal input 70b and their collectors are connected to supply voltage $V_{s+}$. The collectors of transistors 12 and 14 are connected to the emitters of transistors 34, 36 and 40, 42, respectively, to couple currents generated by input stages 11 to gain control circuit 32.

With this configuration, an input signal A applied to input 6 of conventional gain control circuit 2 generates signal currents which are steered by two quadrant gain control circuit 32 to output amplifier 60 and $V_{s+}$ in accordance with a control signal C applied to control signal inputs 70a, 70b, respectively. A similar circuit topology for gain control circuit 4 connects two quadrant gain control circuit 44 to input stage 21 and control signal inputs 70a, 70b. However, the bases of transistors 46, 54 and 48, 56 are connected to control signal inputs 70a and 70b, respectively, so that the distribution of output currents from two quadrant gain control amplifier 44 between $V_{s+}$ and amplifier 60 is opposite to that of gain control circuit 32 for a given control signal C. In addition, resistors 50, 58 connect the collectors of transistors 48, 50, respectively to $V_{s+}$, providing signal summing at output amplifier 60 for the signals generated by input signals A, B. Thus, input signals A, B applied to conventional gain control circuits 2, 4 are mixed according to the signal C at fader control input 70, and applied to output amplifier 60 in a differential manner.

Input stages 11, 21 of gain control circuits 2, 4, respectively, are class A type amplifiers, and require high quiescent currents to achieve large dynamic ranges for input signals A, B. For example, current sources 16, 18, 26, 28 must each provide a quiescent current of approximately 1.25 ($V_{in,peak}$/R) to avoid clipping input signals A, B. Here, $V_{in,peak}$ is the peak input signal and R is the resistance of resistors 20, 30. Thus, transconductance input stages 11, 21 require a total quiescent current that is approximately five times the maximum transconductance current in order to avoid input signal clipping. If resistors 20, 30 are increased and current sources 16, 18, 26, 28 are correspondingly reduced, resistors 20, 30 may operate in conjunction with stray capacitances of transistors 12, 14, 22, 24 to degrade the flatness of the frequency response of conventional fader circuit 10, reducing the slew rate. Typically, the balance between maintaining low quiescent currents and high slew rates leads to the use of resistors 20, 30 that limit slew rates to no more than 100 V/$\mu$s.

Figure 2:
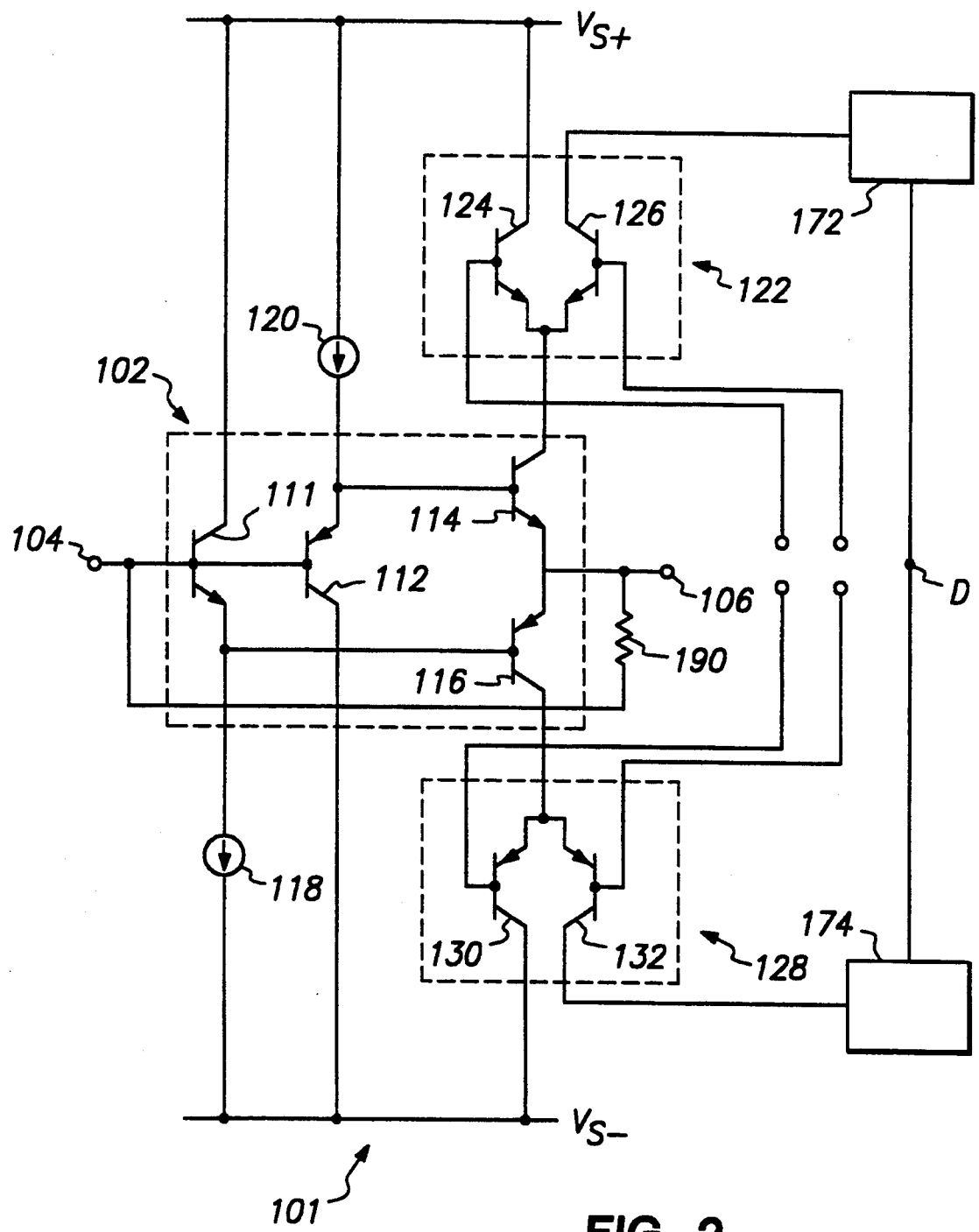
FIG. 2 is a schematic diagram of a complementary gain control circuit in accordance with the present invention.

Referring now to FIG. 2, there is shown a gain control circuit 101 in accordance with the present invention, including a complementary input stage 102, a complementary pair of gain control amplifiers 122, 128, and a complementary pair of current mirrors 172, 174. Complementary input stage 102 has a non-inverting input 104, which is formed by the bases of npn transistor 111 and pnp transistor 112, and an inverting input 106 which is formed by the emitters of npn transistor 114 and pnp transistor 116. Current sources 118, 120 provide quiescent current to input stage 102. Input stage 102 is a class AB amplifier, and may operate at lower quiescent currents than input stages 11, 21 of FIG. 1. The current signal generated by input stage 102 is coupled by the collectors of transistors 114, 116 to gain control amplifiers 122, 128.

In the preferred embodiment of the invention, gain control amplifiers 122, 128 comprise differentially connected transistors 124, 126, and 130, 132, respectively. The bases of transistors 124, 126 form gain control inputs for receiving control signals. The collectors of transistors 124, 126 form the outputs of gain control amplifier 122, and are connected to $V_{s+}$ and current mirror 172, respectively. The emitters of transistors 124, 126 are connected to the collector of transistor 114. Similarly, the bases of transistors 130, 132 form gain control inputs for receiving control signals. The collectors form the outputs of gain control amplifier 128, and are connected to $V_{s-}$ and current mirror 174, respectively. The emitters of transistors 130, 132 are connected to the collector of transistor 116. The gain control signal applied to the bases of npn transistors 124, 126 has a polarity opposite that of the gain control signal applied to the bases of pnp transistors 130, 132.

For small input currents $I_{in}$ at inverting input 106, $I_{in}$ is split equally between the emitters of transistors 114, 116. Thus, for a positive input current (current into input 106), the collector current of transistor 116 increases by $\frac{1}{2} I_{in}$ and the collector current of transistor 114 decreases by $\frac{1}{2} I_{in}$. As a result, collector current $(I_q + \frac{1}{2} I_{ina})$ is divided between the emitters of transistors 130, 132 according to a control signal applied to their bases, while collector current $(I_q - \frac{1}{2} I_{ina})$ is divided between the emitters of transistors 124, 126 according to control signal applied to their bases. Here, $I_q$ is the quiescent current of transistors 114, 116.

For large current signals flowing into inverting input 106 signal distortion will occur. The base resistances, $R_{bbn}$, of npn transistors 124, 126 and the base resistances, $R_{bbp}$, of pnp transistors 130, 132 lead to errors in collector signals $(I_q \pm \frac{1}{2} I_{ina})$, which are given to first order by differences in the factors ($R_{bbn}/\beta n$) and ($R_{bbp}/\beta p$). In general, $R_{bb}$ can be minimized by increasing the size of the corresponding transistor. However, this also decreases the bandwidth of the transistor since stray capacitances increase with transistor size. In balancing these factors, a medium sized transistor is used, resulting in finite current errors attributable to differences in the factors ($R_{bb}/\beta$) for the npn and pnp devices. The errors caused by ($R_{bb}/\beta$) tend to cancel between gain control amplifiers 122, 128. This cancellation is optimized by adjusting the emitter areas of complementary transistor pairs 124, 126 and 130, 132 until ($R_{bbn}/\beta_n$) and ($R_{bbp}/\beta_p$) are equalized for gain control amplifiers 122, 128. In effect, this makes the error currents generated symmetric about $I_{in} = 0$ so that the errors generated for a current signal through transistors 124, 126 are equal to the errors generated for the current signal through 130, 132, and cancel in gain control circuit 101.

Since input voltage errors generated by non-linear emitter impedances of transistors 124, 126 and 130, 132 become increasingly significant as the input current increases, the present invention uses a resistor 190 connected between inverting input 106 and non-inverting input 104 to add an approximately linearizing correction current as input stage 102 enters the AB regime of operation. In this regime, the input current exceeds the quiescent currents of transistors 114, 116, changing the voltage of inverting input 106. For example, as positive input current $I_{ina}$ approaches 2 $I_q$, transistor 114 will turn off while transistor 116 turns on harder. As a result, the voltage at input 106 will vary due to the logarithmic dependence of the emitter voltages on collector currents. In input stage 102, the bases of transistors 114, 116 are held at fixed voltages by the emitters of transistors 111, 112. Consequently, the emitter voltage of transistor 114 increases towards its base voltage, while the emitter voltage of transistor 116 increases away from its base voltage, increasing the voltage of inverting input 106. By adding resistor 190 between inverting input 106 and non-inverting input 104, the voltage change at input 106 generates a correction current which flows in the opposite sense to $I_{ina}$. The combination of these currents partially offsets the effect of the large input current.

Figure 3:
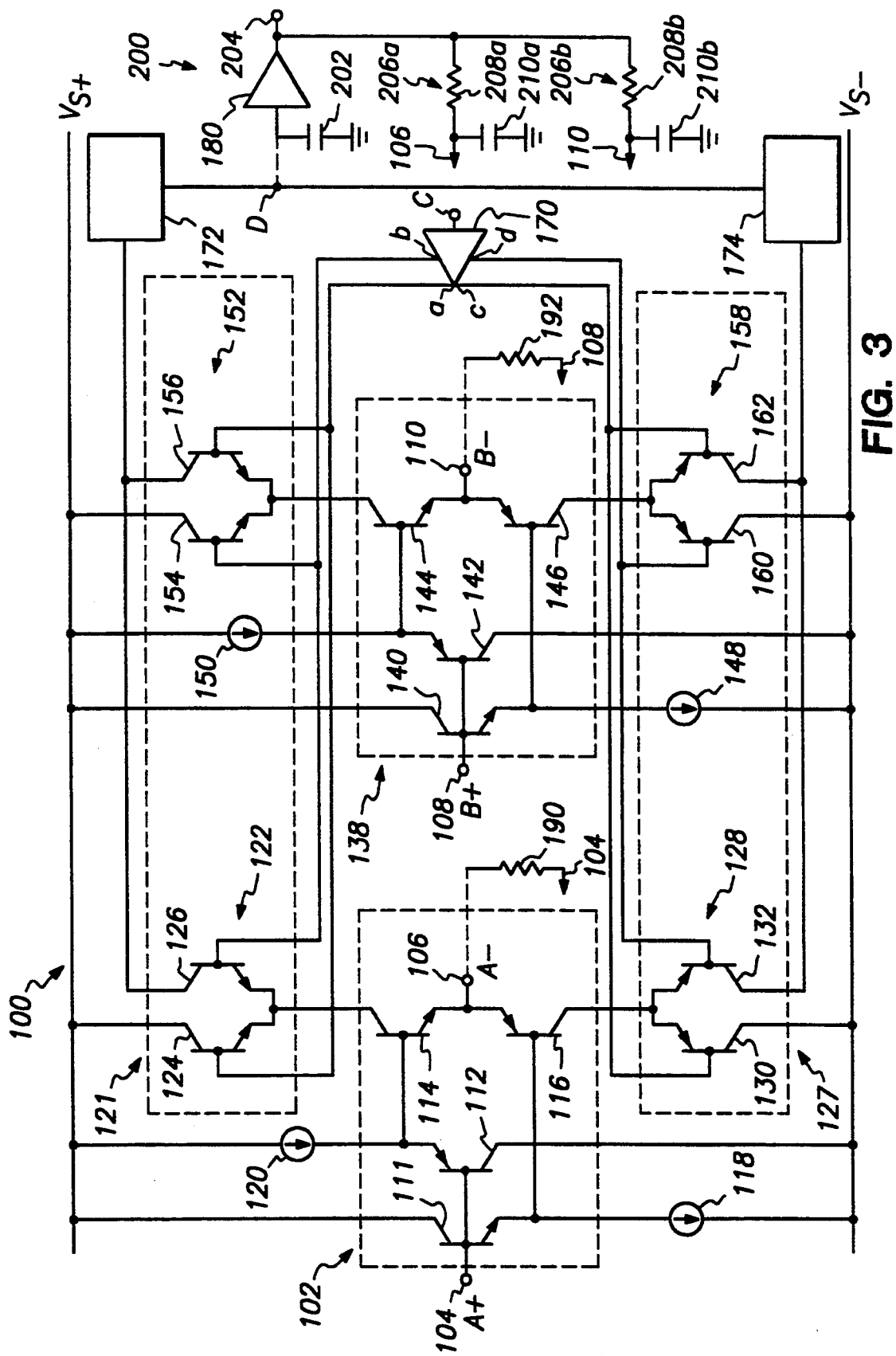
FIG. 3 is a schematic diagram of a complementary fader circuit based on gain control circuits in accordance with the present invention.

Referring now to FIG. 3, there is shown a fader circuit 100 based on gain control circuit 101 of the present invention, wherein a second gain control circuit 105 having an input stage 138 and complementary pair of gain control amplifiers 152, 158 has been added to first gain control circuit 101, to process a second input signal B. In this configuration, first and second gain control circuits 101, 105 share a common set of complementary current mirrors 172, 174. Optionally, a current feedback-type output stage 200 may be used to convert the output current signal at gain node D to a voltage signal.

Input amplifier stage 138 comprises complementary transistors 140, 142, the bases of which form non-inverting input 108, current sources 148, 150 for providing quiescent current to the amplifier, and complementary transistors 144, 146, the emitters of which form inverting input 110. Gain control amplifier 152 comprises differentially connected transistors 154, 156, the bases of which are connected to fader control outputs 170b, 170a, respectively, and the collectors of which are connected to $V_{s+}$ and current mirror 172, respectively. Similarly, gain control amplifier 158 comprises differentially connected pnp transistors 160, 162, the bases of which are connected to fader controls 170d, 170c, respectively, and the collectors of which are connected to $V_{s-}$ and current mirror 174, respectively.

With this configuration, gain control amplifiers 122, 152 form npn two quadrant gain control circuit 121, which steers a current signal generated by input stages 138, 102 in response to input signal A, B between $V_{s+}$ and current mirror 172 in a complementary manner. Thus, changes in the output signals of fader control 170 increase the gain of one of the signals A, B at gain node D, while decreasing the gain of the other signal. Similarly, gain control amplifiers 128, 158 form pnp two quadrant gain control circuit 127, which steers current signals of the other polarity generated by input stages 138, 102, respectively, between $V_{s-}$ and current mirror 174 in the manner described above.

Also shown in FIG. 3 is one embodiment of a fader control 170, which produces a first control signal between outputs 170a, 170b and a complementary control signal, having the same magnitude but opposite polarity from the first control signal, between outputs 170c, 170d in response to a control signal C. The complementary signals produced by fader control 170 adjust the gain of signal currents generated by input stages 102, 138 through complementary gain control amplifiers 122, 128 and 152, 158, respectively.

The outputs of current mirrors 172, 174 are connected to form gain node D. Thus, current mirror 172 receives portions of current signals from input stages 102, 138 by means of two quadrant gain control circuit 121 in accordance with the signal at fader control outputs 170a, 170b. Similarly, current mirror 174 receives portions of current signals from input stages 102, 138 by means of two quadrant gain control circuit 127, the portions being determined in accordance with the complementary signal at fader control outputs 170c, 170d. These scaled current signals are replicated at the outputs of current mirrors 172, 174 and summed to form an output current signal at gain node D.

For example, as fader control output 170a becomes more negative with respect to output 170b, transistor 126 is turned on harder while transistor 124 is turned off harder. Simultaneously, transistor 156 is turned off harder while transistor 154 is turned on harder. As a result, an increasing portion of signal current ½ $I_{ina}$ is directed into current mirror 172 by gain control amplifier 122 while an increasing portion of signal current ½ $I_{inb}$ is directed into supply voltage $V_{s+}$ by gain control amplifier 152. A symmetric process occurs in complementary circuits comprising non-inverting transistors 116, 146, their corresponding gain control amplifiers 128, 158, and complementary current mirror 174. The net result of combining these signal current adjustments from complementary current mirrors 172, 174 is that the composite output current at gain node D is given K $I_{ina}$+ (1-K) $I_{inb}$, where K is adjusted between 0 and 1 by fader control 170.

Also shown in FIG. 3 is a feedback-type output stage 200, including a capacitor 202 connected between gain node D and ground, and an output amplifier 180 connected between gain node D and fader output 20, for convening an output current at gain node D to an output voltage at fader output 204. A pair of feedback circuits 206a, 206b each comprising a pair of feedback resistors 208a, 210a, 208b, 210b couple the voltage at fader output 204 to inverting inputs 106, 110 to provide separately adjustable voltage gains for input stages 102, 138. With this configuration, the output voltage at fader output 204 is:

$$V_{out} = K\ V_{inA}/r_A + K\ (1-K)\ V_{inB}/r_B,$$

where $V_{inA}$, $V_{inB}$ are the voltages of input signals A, B at input stages 102, 138, respectively, and $r_A$, $r_B$ are $R_{210a}/(R_{210a}+R_{208a})$, $R_{210b}/(R_{210b}+R_{208b})$, respectively.

Therefore, a gain control circuit 101 is presented in accordance with the present invention, that uses a low power input stage 102 in conjunction with complementary gain control amplifiers 122, 128 to provide a ground referenced output signal having low distortion. A pair of gain control circuits 101 may be combined to form a fader circuit 100 for generating a composite output signal at a gain node D from input signals A, B in which the amplitude of input signals A, B is controlled by a gain control signal. A current feedback-type amplifier circuit 200 may be combined with fader circuit 100 to provide an output voltage signal in which the gain of each gain control circuit 101, 105 can be separately adjusted by means of feedback circuits 206a, 206b.

What is claimed is:

1. A low power, complementary gain control circuit for controlling the gain of an input signal with a control signal, the complementary gain control circuit comprising:

an amplifier input stage having an inverting input, a non-inverting input, and a pair of current outputs, for generating an output current signal in response to application of an input signal between the inverting and non-inverting inputs;

a pair of complementary gain control amplifiers, each gain control amplifier having a current input, first and second current outputs, and a pair of current gain control inputs, the current input being connected to one of the current outputs of the amplifier input stage and the first current output being connected to a bias supply, for distributing the output current signal from the amplifier input stage between the current outputs of the gain control amplifier in response to a control signal applied to the gain control inputs; and a complementary pair of current mirrors, each current mirror having an input and an output, the input of each current mirror being connected to the second current output of the corresponding current gain amplifier, and the output of each current mirror being connected to a common gain node, to provide an output current to the common gain node.

2. A low power complementary gain control circuit in accordance with claim 1, wherein the pair of complementary gain control amplifiers comprises a pair of differentially connected npn transistors and a differentially connected pair of pnp transistors, respectively, each of the npn and pnp transistors having an emitter, base, and collector, the common emitters, the collectors, and the bases of the differentially connected npn transistors and the common emitters, the collectors, and the bases of the differentially connected pnp transistors respectively forming the current input and corresponding pairs of current outputs and gain control inputs, respectively of the complementary pair of gain control amplifiers.

3. A low power complementary gain control circuit in accordance with claim 2, wherein the emitter areas of the differentially connected npn transistors and the differentially connected pnp transistors are scaled to equalize the ratio of the base resistance to the transistor beta for the differentially connected npn and pnp transistors.

4. A low power complementary gain control circuit in accordance with claim 3, wherein an input resistor is connected between the inverting input of the amplifier stage and the non-inverting input, for coupling correction current in response to non-linear variations in the voltage of the inverting input away from the non-inverting input.

5. First and second low power complementary gain control circuits in accordance with claim 1, wherein the complementary pair of current mirrors and the gain node of the first complementary gain control circuit serves as the complementary pair of current mirrors and the gain node for the second complementary gain control circuit, for mixing signals applied to the input stages of the first and second complementary gain control circuits in accordance with the control signal applied to the gain control inputs of each gain control circuit.

6. First and second low power complementary gain control circuits in accordance with claim 5, wherein the gain control signals applied to the gain control inputs of the first and second gain control circuits have equal magnitudes and opposite polarities, so that the gain of one input signal is increased while the gain of the other input signal is simultaneously decreased in response to adjustment of the gain control signal.

7. First and second low power complementary gain control circuits in accordance with claim 6, wherein the gain node is connected to the first terminal of a capacitor and the input of an output amplifier, the second terminal of the capacitor being connected to ground, for providing output voltage signals at the output of the output amplifier.

8. First and second low power complementary gain control circuits in accordance with claim 7, wherein first and second pairs of feedback resistors are connected between the output of the output amplifier and the inverting inputs of the amplifier input stages of the first and second gain control circuits, respectively, to adjust the voltage gain of the first and second gain control circuits.

* * * * *